United States Patent
Kim et al.

(10) Patent No.: US 10,505,093 B2
(45) Date of Patent: Dec. 10, 2019

(54) HOUSING FOR THERMOELECTRIC MODULE

(71) Applicant: Hyundai Motor Company, Seoul (KR)

(72) Inventors: Byung Wook Kim, Gyeonggi-do (KR); Kyong Hwa Song, Seoul (KR); Jin Woo Kwak, Gyeongsangbuk-do (KR); Gyung Bok Kim, Gyeonggi-do (KR); In Woong Lyo, Gyeonggi-do (KR); Han Saem Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 35 days.

(21) Appl. No.: 15/279,220

(22) Filed: Sep. 28, 2016

(65) Prior Publication Data

US 2017/0345988 A1 Nov. 30, 2017

(30) Foreign Application Priority Data

May 30, 2016 (KR) .......................... 10-2016-0066739

(51) Int. Cl.
*H01L 35/32* (2006.01)
*H05K 5/00* (2006.01)
*H05K 5/02* (2006.01)

(52) U.S. Cl.
CPC ............ *H01L 35/32* (2013.01); *H01L 35/325* (2013.01); *H05K 5/0021* (2013.01); *H05K 5/0213* (2013.01)

(58) Field of Classification Search
CPC ...................................................... H01L 35/32
See application file for complete search history.

(56) References Cited

U.S. PATENT DOCUMENTS

| | | | | |
|---|---|---|---|---|
| 4,759,190 A | * | 7/1988 | Trachtenberg | B60N 3/103 62/3.62 |
| 6,260,360 B1 | * | 7/2001 | Wheeler | A01N 1/02 62/3.6 |
| 6,530,231 B1 | * | 3/2003 | Nagy | F25B 21/02 136/203 |
| 9,859,485 B1 | * | 1/2018 | Kim | H01L 35/04 |

(Continued)

FOREIGN PATENT DOCUMENTS

| | | |
|---|---|---|
| JP | 2000-000029 U | 3/2000 |
| JP | 2008-277584 A | 11/2008 |

(Continued)

OTHER PUBLICATIONS

Adhesive Heat Shrinkable Insulation Tape; Nelco Products; archived webpage from Aug. 1, 2014; https://web.archive.org/web/20140801164425/http://www.nelcoproducts.com/heat-shrink-tubing/heat-shrinkable-insulation-tape (Year: 2014).*

*Primary Examiner* — Edward J. Schmiedel
(74) *Attorney, Agent, or Firm* — Mintz Levin Cohn Ferris Glovsky and Popeo, P.C.; Peter F. Corless

(57) ABSTRACT

A housing for a thermoelectric module can stably protect individual elements of the thermoelectric module such as thermoelectric elements, electrodes, and insulating boards, while maintaining power generation performance of the thermoelectric module. The housing for a thermoelectric module includes: a housing enveloping at least one thermoelectric module; and a heat barrier unit configured to prevent a flow of heat from being transferred through a sidewall of the housing.

7 Claims, 8 Drawing Sheets

(56) References Cited

U.S. PATENT DOCUMENTS

| | | | | |
|---|---|---|---|---|
| 2005/0016183 A1* | 1/2005 | Tateyama | ................ | H01L 35/06 |
| | | | | 62/3.7 |
| 2006/0118159 A1* | 6/2006 | Tsuneoka | ................ | H01L 35/04 |
| | | | | 136/211 |
| 2006/0289051 A1* | 12/2006 | Niimi | ...................... | H01L 35/10 |
| | | | | 136/203 |
| 2007/0028955 A1* | 2/2007 | Sogou | .................... | H01L 35/10 |
| | | | | 136/200 |
| 2008/0041067 A1* | 2/2008 | Matsuoka | ............... | H01L 35/30 |
| | | | | 62/3.7 |
| 2011/0265838 A1* | 11/2011 | Kambe | ................... | H01L 35/30 |
| | | | | 136/223 |
| 2013/0291559 A1* | 11/2013 | June | ....................... | F25B 21/00 |
| | | | | 62/3.2 |
| 2015/0171302 A1 | 6/2015 | Himmer et al. | | |

FOREIGN PATENT DOCUMENTS

| | | |
|---|---|---|
| JP | 2009-188088 A | 8/2009 |
| JP | 2013-247123 A | 12/2013 |

* cited by examiner

HOUSING FOR THERMOELECTRIC MODULE

CROSS-REFERENCE TO RELATED APPLICATION

This application claims under 35 U.S.C. § 119(a) the benefit of Korean Patent Application No. 10-2016-0066739, filed on May 30, 2016 in the Korean Intellectual Property Office, the entire contents of which are incorporated by reference herein.

BACKGROUND (a) Technical Field

The present disclosure relates to a housing enveloping at least one thermoelectric module, more particularly, to the housing that can stably protect individual elements of a thermoelectric module such as thermoelectric elements, electrodes, and insulating boards, while maintaining power generation performance of the thermoelectric module.

(b) Description of the Related Art

A thermoelectric module is used in a thermoelectric power generation system utilizing the Seebeck effect in which a difference in temperatures of both surfaces of the thermoelectric module is used to generate an electromotive force.

During thermoelectric power generation by such a thermoelectric module, the output of the thermoelectric power generation may be increased by maintaining a large temperature difference between a high temperature side and a low temperature side. In particular, a heat transfer rate from a heat source to the thermoelectric module may significantly affect the output.

The thermoelectric module includes a plurality of thermoelectric elements (N-type and P-type semiconductors) having opposite polarities and arranged in an alternating manner. The thermoelectric elements may be electrically connected in series through electrodes, and insulating boards may be attached to respective electrodes.

Meanwhile, when the thermoelectric elements and/or the electrodes of the thermoelectric module come into contact with the outside air under a high temperature environment, they may be oxidized or chemically changed, which may degrade thermoelectric power generation performance.

When moist or conducting liquid (water or the like) contacts the thermoelectric elements and/or the electrodes, it may cause electrical shorting.

In addition, when impacts or shocks occur due to external physical factors, then stress, strain, shear force or the like may cause damage to the thermoelectric module.

In order to protect the thermoelectric module from external chemical and/or physical factors, a technique of packaging the thermoelectric elements, the electrodes, and the like with a metallic housing has been proposed.

In a conventional packaging technique, however, heat transfer may easily occur along sidewalls of the metallic housing, resulting in severe heat loss. Accordingly, it is difficult to secure a temperature difference between the high temperature side and the low temperature side, which may degrade thermoelectric power generation performance.

In addition, when the thermoelectric module is exposed to a heat source for a long period of time or is subjected to repeated temperature changes, thermal stress or thermal shock may occur due to a difference in thermal expansion coefficients between the thermoelectric elements and the electrodes, resulting in damage to the thermoelectric module and malfunction of the thermoelectric module.

Further, an electric wire connected to the electrode of the thermoelectric module may be sealed through hermetic sealing, which may cause severe leakage current due to insulation resistance. The strain of the electric wire may change the electrode resistance, which may degrade thermoelectric power generation performance.

SUMMARY

An aspect of the present disclosure provides a housing for a thermoelectric module, which can effectively prevent an oxidation reaction, chemical changes, and the like that may be caused by external factors, avoid electrical shorting that may be caused by moist, conducting liquid or the like, and protect individual elements of the thermoelectric module from stress, strain, shear force and the like due to external physical factors.

According to an aspect of the present disclosure, a housing for a thermoelectric module includes: a housing enveloping at least one thermoelectric module; and a heat barrier unit configured to prevent a flow of heat from being transferred through a sidewall of the housing.

The housing may include a first base, a second base spaced apart from the first base, and the sidewall provided on a side surface of the housing between the first base and the second base, and the heat barrier unit may be provided on the sidewall of the housing.

The housing may be formed of a metal material, and the heat bather unit may be formed of a material having a thermal conductivity lower than that of the housing.

An electric wire connected to an electrode may pass through the heat bather unit and may be disposed in a horizontal direction.

The thermoelectric module may include: at least one pair of thermoelectric elements having opposite polarities and alternating with each other; and a plurality of electrodes connecting the pair of thermoelectric elements in series.

The thermoelectric module may further include a pair of insulating boards attached to the plurality of electrodes, and the pair of insulating boards may be spaced apart from each other.

According to another aspect of the present disclosure, a housing for a thermoelectric module includes: a first housing including a first base and a first sidewall disposed on edges of the first base; a second housing including a second base and a second sidewall disposed on edges of the second base; and a heat barrier unit provided between the first sidewall and the second sidewall, wherein the first base and the second base are spaced apart from each other, and the first sidewall and the second sidewall are extended to face each other.

The heat bather unit may include a bonding member formed of a resin material, and the first sidewall and the second sidewall may be sealed by the bonding member.

The bonding member may be formed of a heat shrinkable film.

The heat barrier unit may further include a sealing tube sealing an electric wire.

The heat bather unit may further include a tube into which an electric wire is inserted, and a sealing cap sealing the tube.

An inner diameter of the tube may be larger than an outer diameter of the electric wire, such that a gap may be formed between an internal surface of the tube and an external surface of the electric wire.

The first and second housings may further include fitting parts provided on the first and second sidewalls, respectively, and the bonding member may be bonded to the fitting parts.

The fitting parts may include a first fitting part provided on an end of the first sidewall, and a second fitting part provided on an end of the second sidewall.

Each of the first and second fitting parts may include a horizontal portion extending in a horizontal direction and a bent portion bent with respect to the horizontal portion at a predetermined angle.

The first and second fitting parts may be disposed to be adjacent to the inside of the first and second housings.

The first and second fitting parts may be disposed in opposite positions in relation to the first and second sidewalls.

The housing may further include a thermal resistance increasing part increasing thermal resistance with respect to a flow of heat transferred through the first and second sidewalls.

The thermal resistance increasing part may include a thin wall portion provided in a portion of at least one of the first and second sidewalls, and the thin wall portion may be thinner than the sidewall.

The thermal resistance increasing part may include a non-straight portion provided in a portion of at least one of the first and second sidewalls.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
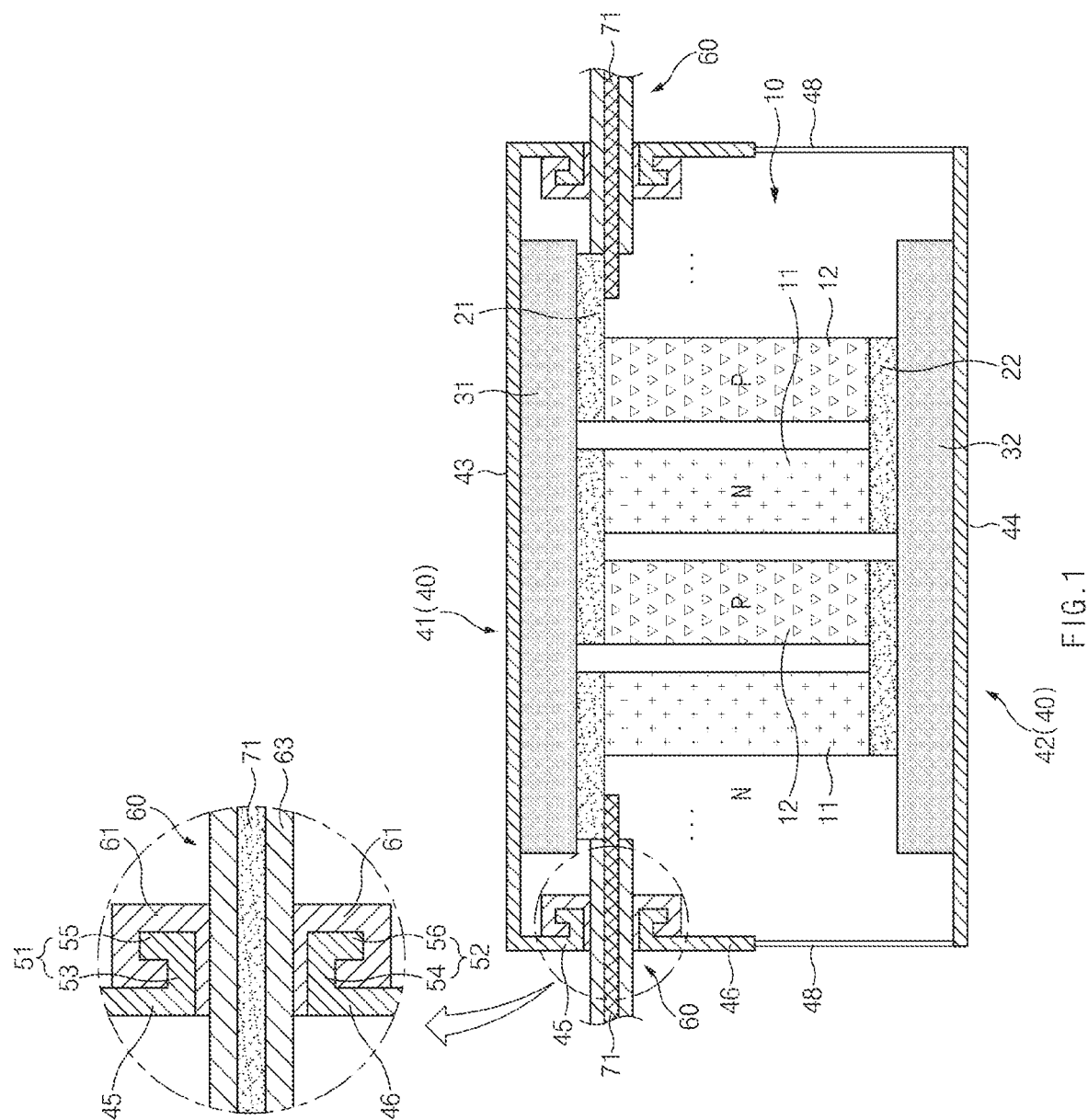
FIG. 1 is a cross-sectional view of a thermoelectric module and a housing for a thermoelectric module, according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, exemplary embodiments of the present disclosure will be described in detail with reference to the accompanying drawings. For reference, the dimensions of elements, thicknesses of lines, and the like, illustrated in the drawings referred to in the description of exemplary embodiments of the present disclosure, may be exaggerated for convenience of understanding. In addition, terms used for describing the present inventive concept have been defined in consideration of the functions of elements, and may be altered in accordance with the intention of a user or an operator, in view of practice, or the like. Therefore, the terms should be defined on the basis of the entirety of this specification.

Referring to FIG. 1, a thermoelectric module, according to exemplary embodiments of the present disclosure, includes one or more first thermoelectric elements 11 and one or more second thermoelectric elements 12 that are arranged in an alternating manner, and a plurality of electrodes 21 and 22 electrically connecting the first and second thermoelectric elements 11 and 12 in series.

The first and second thermoelectric elements 11 and 12 that are semiconductors having opposite polarities may be paired while alternating with each other. Adjacent first and second thermoelectric elements 11 and 12 may form a semiconductor pair. For example, when the first thermoelectric element 11 is an N-type semiconductor, the second thermoelectric element 12 is a P-type semiconductor. On the contrary, when the first thermoelectric element 11 is a P-type semiconductor, the second thermoelectric element 12 is an N-type semiconductor.

As shown in FIG. 1, the plurality of electrodes 21 and 22 includes at least one first electrode 21 connecting the top of the first thermoelectric element 11 to the top of the second thermoelectric element 12, and at least one second electrode 22 connecting the bottom of the first thermoelectric element 11 to the bottom of the second thermoelectric element 12. The first and second electrodes 21 and 22 may be disposed on the tops and bottoms of the first and second thermoelectric elements 11 and 12 in a zigzag arrangement, thereby electrically connecting the first and second thermoelectric elements 11 and 12 in series.

The thermoelectric module 10 according to exemplary embodiments of the present disclosure further includes a first insulating board 31 provided with respect to one or more first electrodes 21, and a second insulating board 32 provided with respect to one or more second electrodes 22.

The plurality of first electrodes 21 and the plurality of second electrodes 22 may be provided on facing surfaces of the first insulating board 31 and the second insulating board 32, respectively.

As shown in FIG. 1, the plurality of first electrodes 21 may be formed to be integrated on a bottom surface of the first insulating board 31 through a patterning process or the like. Alternatively, the plurality of first electrodes 21 may be attached to the bottom surface of the first insulating board 31 through an adhesive or soldering.

As shown in FIG. 1, the plurality of second electrodes 22 may be formed to be integrated on a top surface of the second insulating board 32 through a patterning process or the like. Alternatively, the plurality of second electrodes 22 may be attached to the top surface of the second insulating board 32 through an adhesive or soldering.

The first insulating board 31 and the second insulating board 32 may be spaced apart from each other in a vertical direction, such that the first and second thermoelectric elements 11 and 12 may be disposed in a vertical direction between the first insulating board 31 and the second insulating board 32, and the adjacent first and second thermoelectric elements 11 and 12 may be spaced apart from each other in a horizontal direction therebetween.

Meanwhile, the first insulating board 31 and the second insulating board 32 may form a low temperature part and a high temperature part, respectively, in order to produce an appropriate temperature difference. For example, a cooling unit may be integrally provided in the inside of the first insulating board 31 or may be attached to the outside of the first insulating board 31, such that the first insulating board 31 may be configured as the low temperature part (a heat dissipation part); and a heat source may be integrated with the second insulating board 32 or may be attached to the second insulating board 32, such that the second insulating board 32 may be configured as the high temperature part (a heat absorption part).

According to the exemplary embodiment shown in FIG. 1, the cooling unit is provided with the first insulating board 31 such that the first insulating board 31 may be configured as the low temperature part (the heat dissipation part), and the heat source is provided with the second insulating board 32 such that the second insulating board 32 may be configured as the high temperature part (the heat absorption part).

On the contrary, the heat source is provided with the first insulating board 31 such that the first insulating board 31 may be configured as the high temperature part (the heat absorption part); and the cooling unit is provided with the second insulating board 32 such that the second insulating board 32 may be configured as the low temperature part (the heat dissipation part).

A housing 40 according to exemplary embodiments of the present disclosure may envelop one or more thermoelectric modules 10.

The housing 40 may be formed of a material having high thermal resistance and high rigidity so as to protect the thermoelectric elements 11 and 12, the electrodes 21 and 22, and the insulating boards 31 and 32 of the thermoelectric module 10. For example, the housing 40 may be formed of a metal such as stainless steel or a ceramic.

According to an exemplary embodiment, the housing 40 includes a first housing 41 and a second housing 42.

The first housing 41 has a first base 43 covering a top surface of the first insulating board 31, and a first sidewall 45 disposed on edges of the first base 43.

The first sidewall 45 may extend along the edges of the first base 43, and thus, the first housing 41 may envelop the first insulating board 31 and parts adjacent to the first insulating board 31.

The second housing 42 has a second base 44 covering a bottom surface of the second insulating board 32 and a second sidewall 46 disposed on edges of the second base 44.

The second sidewall 46 may extend along the edges of the second base 44, and thus, the second housing 42 may envelop the second insulating board 32 and parts adjacent to the second insulating board 32.

The first sidewall 45 and the second sidewall 46 may be extended to face each other such that they cover side surfaces of the thermoelectric module 10, i.e., lateral space between the first insulating board 31 and the second insulating board 32.

Meanwhile, heat may be transferred through the sidewalls 45 and 46 of the housing 40 due to a temperature difference between the high temperature part and the low temperature part. As heat is transferred through the sidewalls 45 and 46, heat loss may occur and the temperature difference between the high temperature part and the low temperature part may not be stably maintained, which may degrade thermoelectric power generation performance.

In this regard, in exemplary embodiments of the present disclosure, a heat barrier unit 60 may be provided to prevent the transfer of heat through the sidewalls 45 and 46 of the housing 40.

According to exemplary embodiments, the heat bather unit 60 may be formed of a material having thermal conductivity lower than that of the housing 40. For example, the heat bather unit 60 may be formed of a material having low thermal conductivity such as resin such that it may prevent or reduce the flow of heat transferred through the sidewalls 45 and 46 of the metallic housing 40.

In addition, the heat bather unit 60 may combine the first sidewall 45 of the first housing 41 with the second sidewall 46 of the second housing 42 in a sealing manner, such that it may secure the sealability and bonding properties of the first and second housings 41 and 42 enveloping the thermoelectric module 10.

According to exemplary embodiments, the heat barrier unit 60 includes a bonding member 61, and the bonding member 61 may be formed of a sheet or film made of a material capable of being melted by heat. For example, the bonding member 61 may be formed of a resin material capable of being melted by heat such that it may hermetically seal the first housing 41 and the second housing 42.

In addition, the flow of heat transferred through the first sidewall 45 of the first housing 41 and the second sidewall 46 of the second housing 42 may be prevented or reduced by the bonding member 61 formed of the resin material.

According to exemplary embodiments of the present disclosure, the bonding member 61 may be formed of a heat shrinkable film or sheet. By applying heat to the bonding member 61 using an electron-beam, laser, or the like, in a state in which the bonding member 61 is interposed between the first sidewall 45 of the first housing 41 and the second sidewall 46 of the second housing 42, the bonding member 61 formed of the heat shrinkable film or sheet may be thermally shrunk and attached between the first sidewall 45 of the first housing 41 and the second sidewall 46 of the second housing 42, and then may be cured, whereby the first sidewall 45 and the second sidewall 46 may be firmly combined by thermal shrinkage of the bonding member 61, and a gap between the first sidewall 45 and the second sidewall 46 may be hermetically sealed.

Meanwhile, an electric wire or a lead may be connected to the first electrode 21 or the second electrode 22. The electric wire or the lead may be led to the outside of the housings 41 and 42 to output electrical energy generated by the thermoelectric elements 11 and 12 and the electrodes 21 and 22 externally. Hereinafter, the electric wire or the lead for outputting electrical energy will be referred to as an "electric wire 71", and the electric wire 71 includes all types of output units for outputting the electrical energy generated by the thermoelectric elements 11 and 12 and the electrodes 21 and 22 externally.

According to exemplary embodiments, the electric wire 71 may be connected to the first electrode 21 to be led to the outside of the housings 41 and 42.

According to exemplary embodiments of the present disclosure, the electric wire 71 may pass through the bonding member 61 of the heat barrier unit 60 to be led to the outside of the housings 41 and 42 in a horizontal direction.

By allowing the electric wire 71 to pass through the bonding member 61 of the heat barrier unit 60 and to be provided in the horizontal direction, electrical connections with respect to adjacent electrical components may easily be made, and a lead-out length of the electric wire 71 may be optimized such that insulation resistance may be minimized. Therefore, leakage may be prevented during the thermoelectric power generation, and the strain of the electric wire 71 may be prevented such that variations in resistance of the electrodes 21 and 22 may be minimized.

According to exemplary embodiments of the present disclosure, the heat barrier unit 60 further includes a sealing tube 63 for sealing the electric wire 71 as shown in FIGS. 1 to 5.

The sealing tube 63 may be formed of an insulating resin material, and may be provided to pass through a portion of the bonding member 61. By hermetically inserting the electric wire 71 into the inside of the sealing tube 63, sealability and insulating properties with respect to the electric wire 71 passing through the heat barrier unit 60 may be secured.

In particular, the sealing tube 63 may be extended in a direction perpendicular to the sidewalls 45 and 46 of the housing 40, i.e., in a horizontal direction, such that the electric wire 71 sealed by the sealing tube 63 may easily be provided in the horizontal direction. By allowing the electric wire 71 to pass through the sealing tube 63 and be led out in the horizontal direction, the insulation resistance of the electric wire 71 may be minimized, whereby leakage may be prevented during the thermoelectric power generation, and the strain of the electric wire 71 may be prevented such that variations in resistance of the electrodes 21 and 22 may be minimized.

According to exemplary embodiments of the present disclosure, the sealing tube 63 may be formed of a heat shrinkable tube. By applying heat to an external surface of the sealing tube 63, the sealing tube 63 formed of the heat shrinkable tube may be thermally shrunk and attached to an external surface of the electric wire 71, whereby sealability and insulating properties of the electric wire 71 may be secured.

Figure 3:
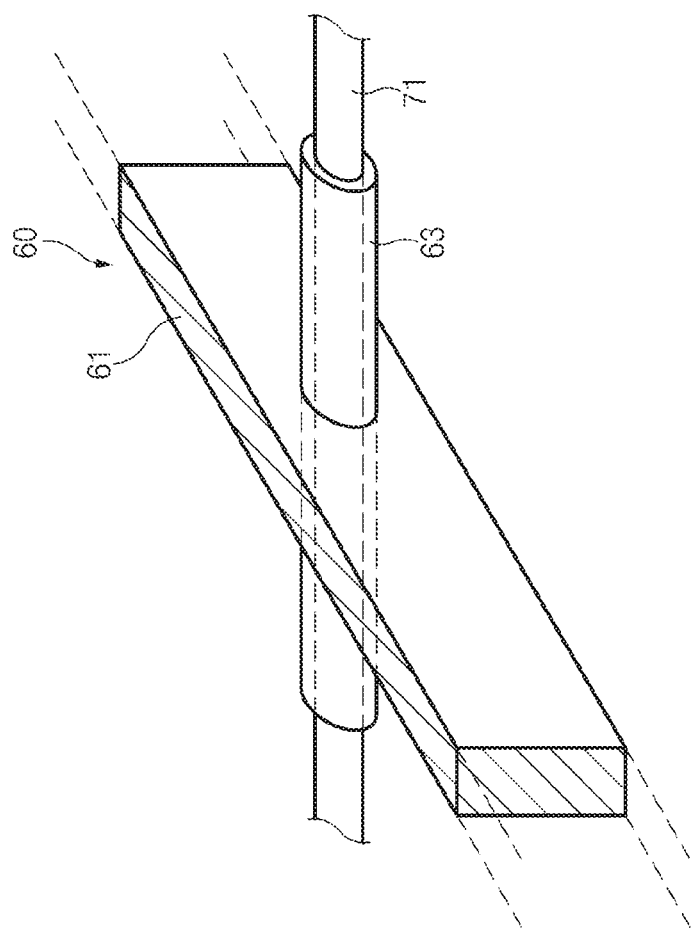
FIG. 3 is a perspective view of a bonding state of a bonding member and a sealing tube of a heat barrier unit in a housing for a thermoelectric module, according to an exemplary embodiment of the present disclosure.

FIG. 3 illustrates a state of the heat barrier unit 60 before being bonded between the first sidewall 45 of the first housing 41 and the second sidewall 46 of the second housing 42. As shown in FIG. 3, the sealing tube 63 formed of the heat shrinkable tube may be provided to pass through a portion of the bonding member 61 formed of the heat shrinkable film.

A bonding process of the first sidewall 45 of the first housing 41 and the second sidewall 46 of the second housing 42 using the heat barrier unit 60 will be detailed below. First, when heat is applied to the sealing tube 63 formed of the heat shrinkable tube, the sealing tube 63 may be hermetically attached to the external surface of the electric wire 71 through thermal shrinkage of the sealing tube 63, and thus, the sealability and insulating properties of the electric wire 71 may be secured. Thereafter, when heat is applied to the bonding member 61 in a state in which the bonding member 61 formed of the heat shrinkable film is interposed between the first sidewall 45 of the first housing 41 and the second sidewall 46 of the second housing 42, the bonding member 61 may be firmly bonded to the first sidewall 45 of the first housing 41 and the second sidewall 46 of the second housing 42, and sealability may be secured.

Figure 6:
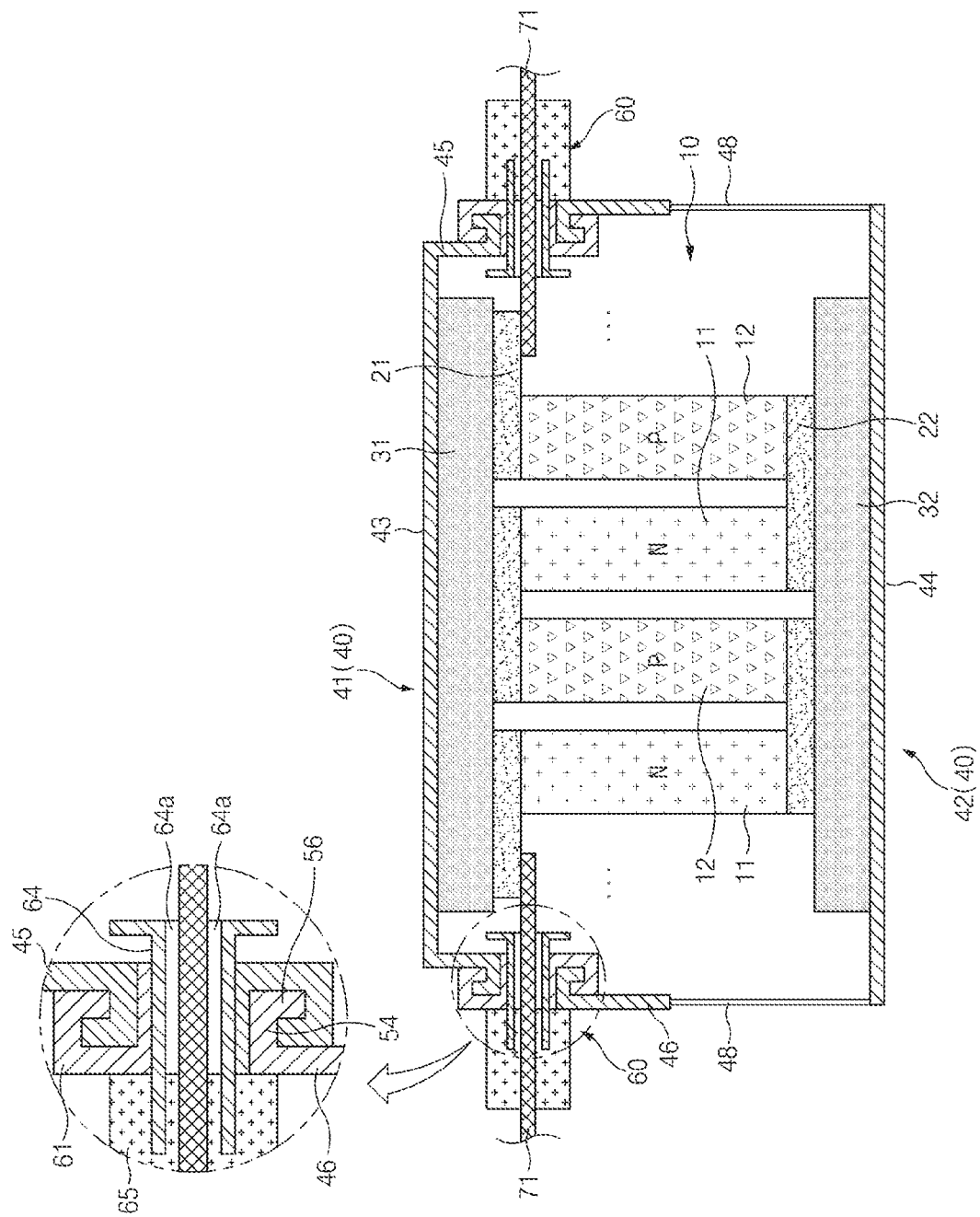
FIG. 6 is a cross-sectional view of a thermoelectric module and a housing for a thermoelectric module, according to another exemplary embodiment of the present disclosure.

According to exemplary embodiments of the present disclosure, the heat barrier unit 60 further includes a tube 64 into which the electric wire 71 is inserted, and a sealing cap 65 sealing an end portion of the tube 64, as shown in FIG. 6.

The tube 64 may be formed of an insulating material such as resin. An inner diameter of the tube 64 may be larger than an outer diameter of the electric wire 71. When the electric wire 71 is inserted into the inside of the tube 64, a gap 64a may be formed between an internal surface of the tube 64 and the external surface of the electric wire 71. An inert gas may be injected into the inside of the first and second housings 41 and 42, or air within the first and second housings 41 and 42 may be discharged externally through the gap 64a between the tube 64 and the electric wire 71, thereby vacuumizing the internal space of the housing 40.

The sealing cap 65 may be provided to seal the outer end portion of the tube 64 after the injection of the inert gas or the vacuumizing operation through the gap 64a between the tube 64 and the electric wire 71.

The sealing cap 65 may be formed of an insulating resin material to implement the sealing of the tube 64 and the insulation of the electric wire 71.

The sealing cap 65 may be formed of a heat shrinkable material. By applying heat to the sealing cap 65 formed of the heat shrinkable material, the sealing cap 65 formed of the heat shrinkable material may be thermally shrunk and attached to the external and internal surfaces of the tube 64, thereby firmly sealing the end portion of the tube 64. In addition, the sealing cap 65 may also be attached to a portion of the external surface of the electric wire 71, whereby the insulating properties of the electric wire 71 may also be secured.

The tube 64 may be extended in a direction perpendicular to the sidewalls 45 and 46 of the housings 41 and 42, i.e., in a horizontal direction, such that the electric wire 71 provided in the tube 64 may easily be provided in the horizontal direction. By allowing the electric wire 71 to pass through the tube 64 and be led out in the horizontal direction, the insulation resistance of the electric wire 71 may be minimized, whereby leakage may be prevented during the thermoelectric power generation, and the strain of the electric wire 71 may be prevented such that variations in resistance of the electrodes 21 and 22 may be minimized.

Meanwhile, the heat barrier unit 60 may be disposed to be adjacent to the low temperature part so as to effectively prevent strain due to heat of the high temperature part and prevent dielectric breakdown or shorting of the electric wire 71.

According to the exemplary embodiment of FIG. 1, when the first insulating board 31 and the first electrode 21 are configured to form the low temperature part, the heat bather unit 60 may be disposed to be adjacent to the first insulating board 31 and the first electrode 21. To this end, as shown in FIG. 1, the first sidewall 45 may be shorter than the second sidewall 46, and thus, the heat barrier unit 60 may be disposed to be adjacent to the first electrode 21 and the first insulating board 31 forming the low temperature part.

Alternatively, according to another exemplary embodiment, when the second insulating board 32 and the second electrode 22 are configured to form the low temperature part, the heat bather unit 60 may be disposed to be adjacent to the second insulating board 32 and the second electrode 22. To this end, the second sidewall 46 may be shorter than the first sidewall 45, and thus, the heat barrier unit 60 may be disposed to be adjacent to the second electrode 22 and the second insulating board 32 forming the low temperature part.

According to exemplary embodiments of the present disclosure, fitting parts 51 and 52 may be provided with the first sidewall 45 of the first housing 41 and the second sidewall 46 of the second housing 42, respectively, and the heat barrier unit 60 may be provided on the fitting parts 51 and 52, whereby the sealability and bonding properties of the first housing 41 and the second housing 42 through the heat barrier unit 60 may be further stabilized and secured.

The fitting parts 51 and 52 include a first fitting part 51 provided at the bottom of the first sidewall 45 of the first housing 41, and a second fitting part 52 provided at the top of the second sidewall 46 of the second housing 42.

The first fitting part 51 includes a first horizontal portion 53 extending from the bottom of the first sidewall 45 of the first housing 41 in a horizontal direction, and a first bent portion 55 bent from an end of the first horizontal portion 53 at a predetermined angle.

The first horizontal portion 53 may be extended from the first sidewall 45 of the first housing 41 toward the internal space of the housing in the horizontal direction.

FIG. 1 illustrates the first bent portion 55 being bent at approximately 90 degrees with respect to the first horizontal portion 53 by way of example. However, the first bent portion 55 may be bent at an angle smaller than 90° or at an angle larger than 90°.

Meanwhile, corners of the first horizontal portion 53 and the first bent portion 55 may be rounded, such that the bonding member 61 may easily be fitted to the first fitting part 51.

The second fitting part 52 includes a second horizontal portion 54 extending from the top of the second sidewall 46 of the second housing 42 in a horizontal direction, and a second bent portion 56 bent from an end of the second horizontal portion 54 at a predetermined angle.

The second horizontal portion 54 may be extended from the second sidewall 46 of the second housing 42 toward the internal space of the housing in the horizontal direction.

FIG. 1 illustrates the second bent portion 56 being bent at approximately 90 degrees with respect to the second horizontal portion 54 by way of example. However, the second bent portion 56 may be bent at an angle smaller than 90° or at an angle larger than 90°.

Meanwhile, corners of the second horizontal portion 54 and the second bent portion 56 may be rounded, such that the bonding member 61 may easily be fitted to the second fitting part 52.

According to exemplary embodiments of the present disclosure, when the bonding member 61 is formed of a heat shrinkable tube, heat may be applied to the bonding member 61 after the bonding member 61 is easily inserted into the first and second fitting parts 51 and 52, and thus, the bonding member 61 may be thermally shrunk and cured while being hermetically attached to the first and second fitting parts 51 and 52, whereby the sealability and bonding properties through the bonding member 61 may be stably secured.

Meanwhile, the first horizontal portion 53 and the first bent portion 55 of the first fitting part 51 may be disposed inwardly of the first sidewall 45 of the first housing 41 and the second horizontal portion 54, and the second bent portion 56 of the second fitting part 52 may be disposed inwardly of the second sidewall 46 of the second housing 42, and thus, when heat is applied to the bonding member 61 formed of the heat shrinkable tube, the overheat of the bonding member 61 may be prevented and stable thermal shrinkage of the bonding member 61 may be induced. In addition, the bonding member 61 may be disposed in the internal space of the housings 41 and 42, such that it may be concealed from the outside, and thus, the possibility of damage thereof may be minimized.

According to other exemplary embodiments of the present disclosure, the bonding member 61 may be formed to have a shape corresponding to the aforementioned structure of the first and second fitting parts 51 and 52, and the bonding member 61 may be forcibly fitted to the first and second fitting parts 51 and 52. Thus, the bonding force and sealability of the first and second housings 41 and 42 through the bonding member 61 may be stably secured, and the assembly of the first and second housings 41 and 42 may be convenient and easy.

According to exemplary embodiments of the present disclosure, a thermal resistance increasing part 48 or 49 may be further provided on the sidewall 46 of the housing 40.

The thermal resistance increasing part 48 or 49 may be provided to increase thermal resistance at the sidewall 46 of the housing 40, thereby minimizing the flow or transfer of heat through the sidewall 46 of the housing 40.

Figure 2:
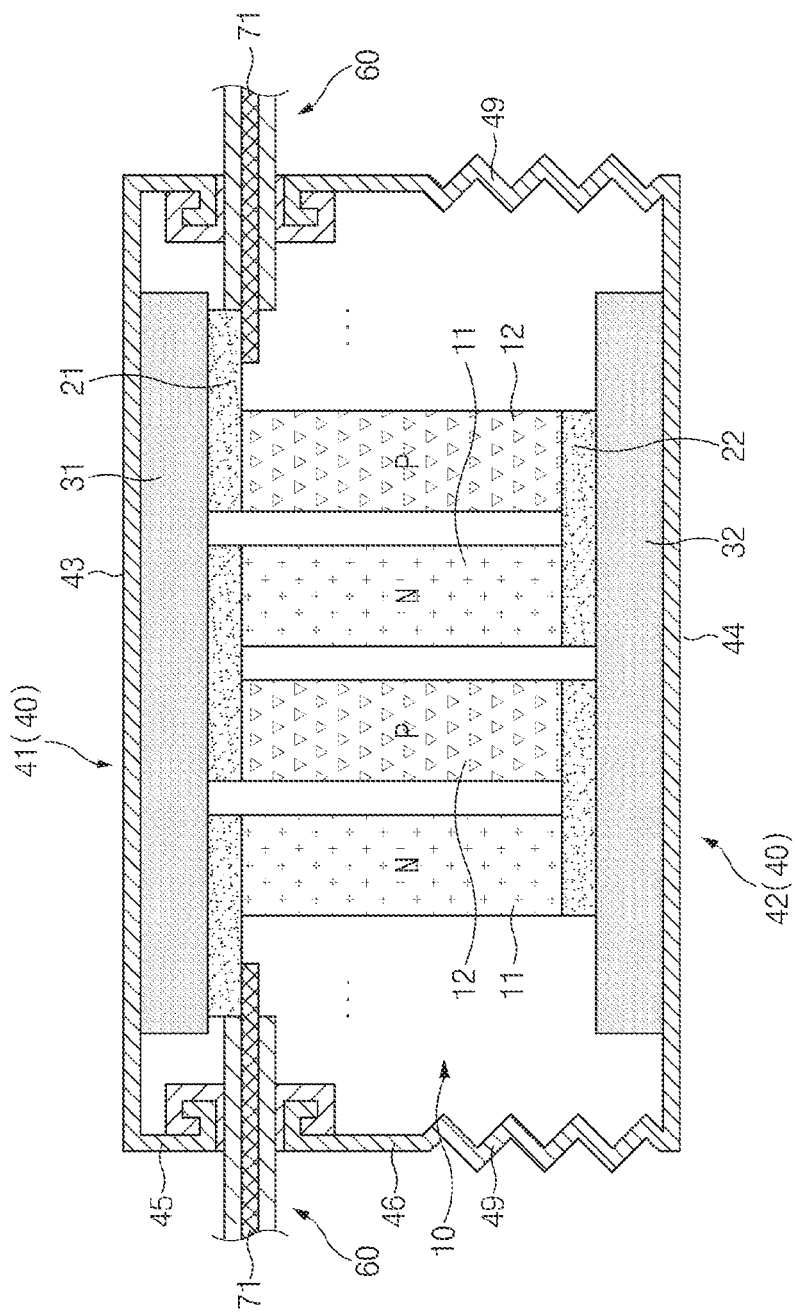
FIG. 2 is a cross-sectional view of a thermoelectric module and a housing for a thermoelectric module, according to another exemplary embodiment of the present disclosure.

The thermal resistance increasing part 48 or 49 may be provided on at least one of the first sidewall 45 and the second sidewall 46. In particular, the thermal resistance increasing part 48 or 49 may be disposed on the sidewall that is adjacent to the high temperature part, so as to minimize the flow or transfer of heat through the sidewall 45 or 46. As shown in FIGS. 1 and 2, the thermal resistance increasing parts 48 and 49 may be formed on the second sidewall 46 that is adjacent to the high temperature part.

According to an exemplary embodiment, as shown in FIG. 1, the thermal resistance increasing part 48 may be provided as a thin wall portion 48 that is formed in a portion of the sidewall 46, and the thin wall portion 48 may be thinner than the sidewall 46. By allowing heat to flow through the thin wall portion 48, thermal resistance may be increased.

According to another exemplary embodiment, as shown in FIG. 2, the thermal resistance increasing part 49 may be provided as a non-straight portion 49 that is formed to have a zigzag structure or a curved structure in a portion of the sidewall 46, thereby increasing thermal resistance.

Figure 4:
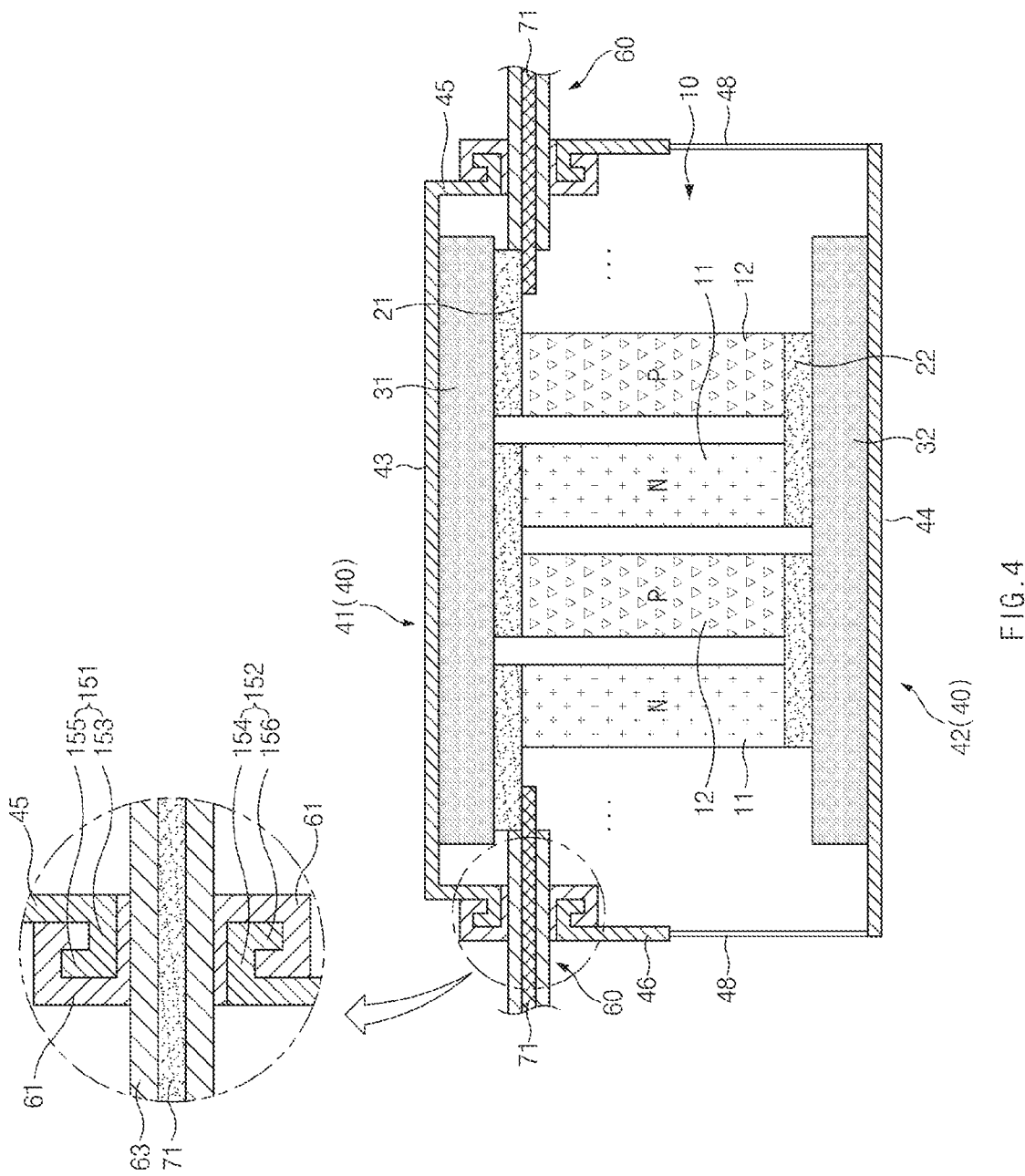
FIG. 4 is a cross-sectional view of a thermoelectric module and a housing for a thermoelectric module, according to another exemplary embodiment of the present disclosure.
Figure 5:
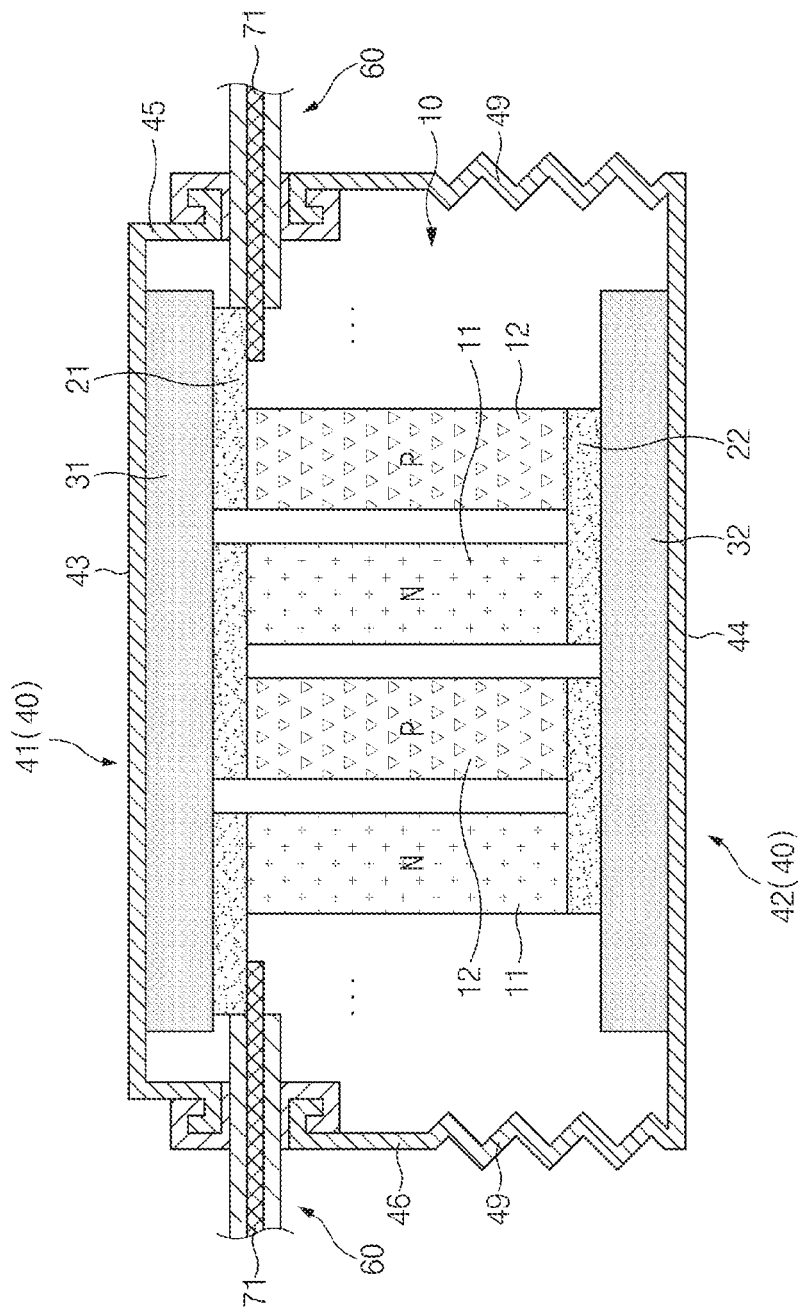
FIG. 5 is a cross-sectional view of a thermoelectric module and a housing for a thermoelectric module, according to another exemplary embodiment of the present disclosure.

Referring to FIGS. 4 and 5, according to other exemplary embodiments, fitting parts 151 and 152 include a first fitting part 151 provided at the bottom of the first sidewall 45 of the first housing 41, and a second fitting part 152 provided at the top of the second sidewall 46 of the second housing 42. The first fitting part 151 and the second fitting part 152 may be formed in opposite positions in relation to the first and second sidewalls 45 and 46 of the housings 41 and 42.

The first fitting part 151 includes a first horizontal portion 153 extending from the bottom of the first sidewall 45 in a horizontal direction, and a first bent portion 155 bent from an end of the first horizontal portion 153 at a predetermined angle.

The first horizontal portion 153 may be extended from the first sidewall 45 toward the exterior space of the first housing 41 in the horizontal direction.

FIGS. 4 and 5 illustrate the first bent portion 155 being bent at approximately 90 degrees with respect to the first horizontal portion 153 by way of example. However, the first bent portion 155 may be bent at an angle smaller than 90° or at an angle larger than 90°.

Meanwhile, corners of the first horizontal portion 153 and the first bent portion 155 may be rounded, thereby allowing the bonding member 61 to be fitted more stably.

The second fitting part 152 includes a second horizontal portion 154 extending from the top of the second sidewall 46 of the second housing 42 in a horizontal direction, and a second bent portion 156 bent from an end of the second horizontal portion 154 at a predetermined angle.

The second horizontal portion 154 may be extended from the second sidewall 46 toward the internal space of the second housing 42 in the horizontal direction.

FIGS. 4 and 5 illustrate the second bent portion 156 being bent at approximately 90 degrees with respect to the second horizontal portion 154 by way of example. However, the second bent portion 156 may be bent at an angle smaller than 90° or at an angle larger than 90°.

Meanwhile, corners of the second horizontal portion 154 and the second bent portion 156 may be rounded, thereby allowing the bonding member 61 to be fitted more stably.

As stated above, the first fitting part 151 and the second fitting part 152 may be formed in opposite positions in relation to the sidewalls 45 and 46 of the housings 41 and 42, whereby the assembly workability may be improved by the bonding member 61, and the sealability and bonding properties may be further improved by the bonding member 61.

In the above descriptions with reference to FIGS. 4 and 5, the first horizontal portion 153 and the first bent portion 155 of the first fitting part 151 are positioned outwardly of the first housing 41, and the second horizontal portion 154 and the second bent portion 156 of the second fitting part 152 are positioned inwardly of the second housing 42, but the present inventive concept is not limited thereto. Alternatively, the first horizontal portion 153 and the first bent portion 155 of the first fitting part 151 may be positioned inwardly of the first housing 41, and the second horizontal portion 154 and the second bent portion 156 of the second fitting part 152 may be positioned outwardly of the second housing 42.

Figure 7:
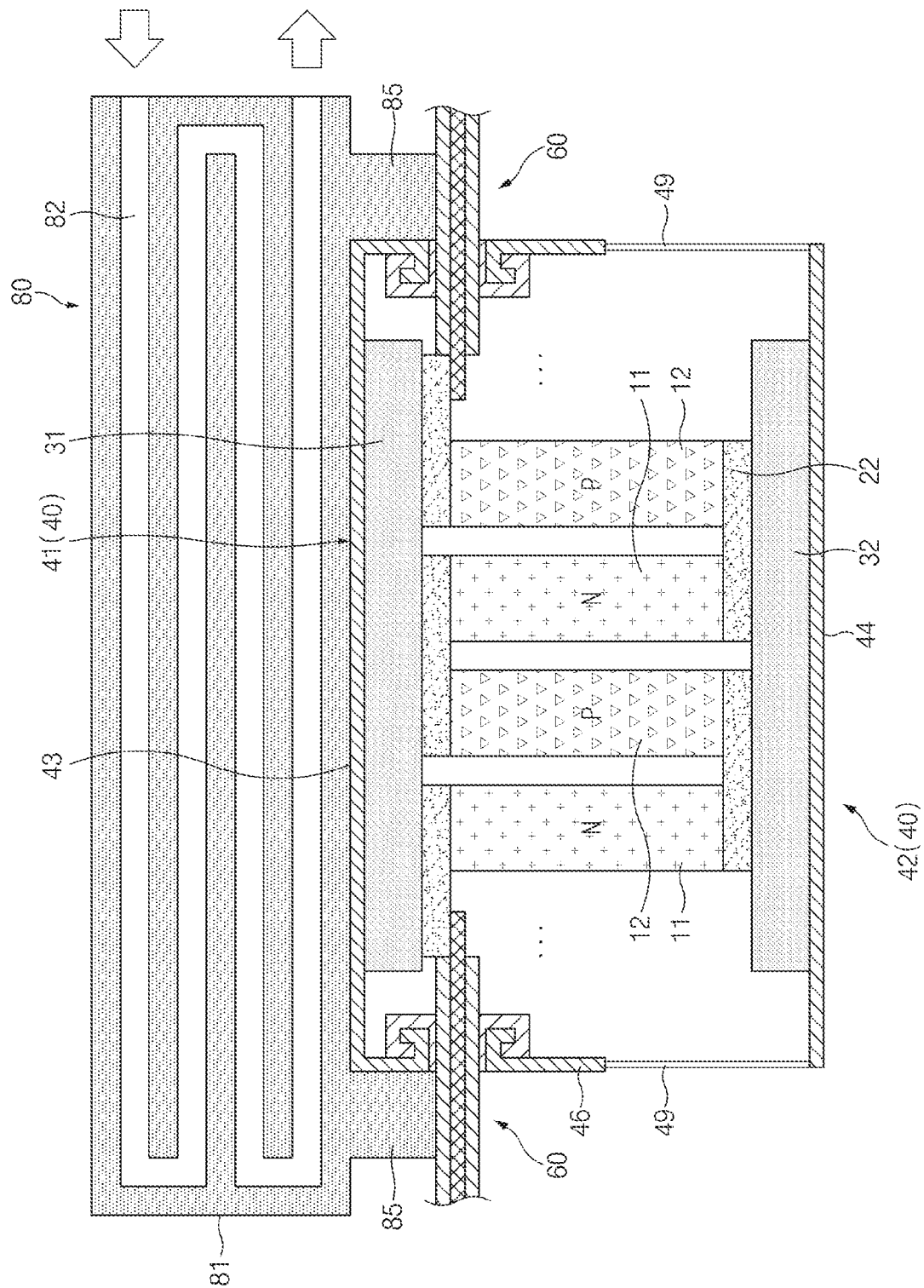
FIG. 7 is a cross-sectional view of a thermoelectric module and a housing for a thermoelectric module, according to another exemplary embodiment of the present disclosure.
Figure 8:
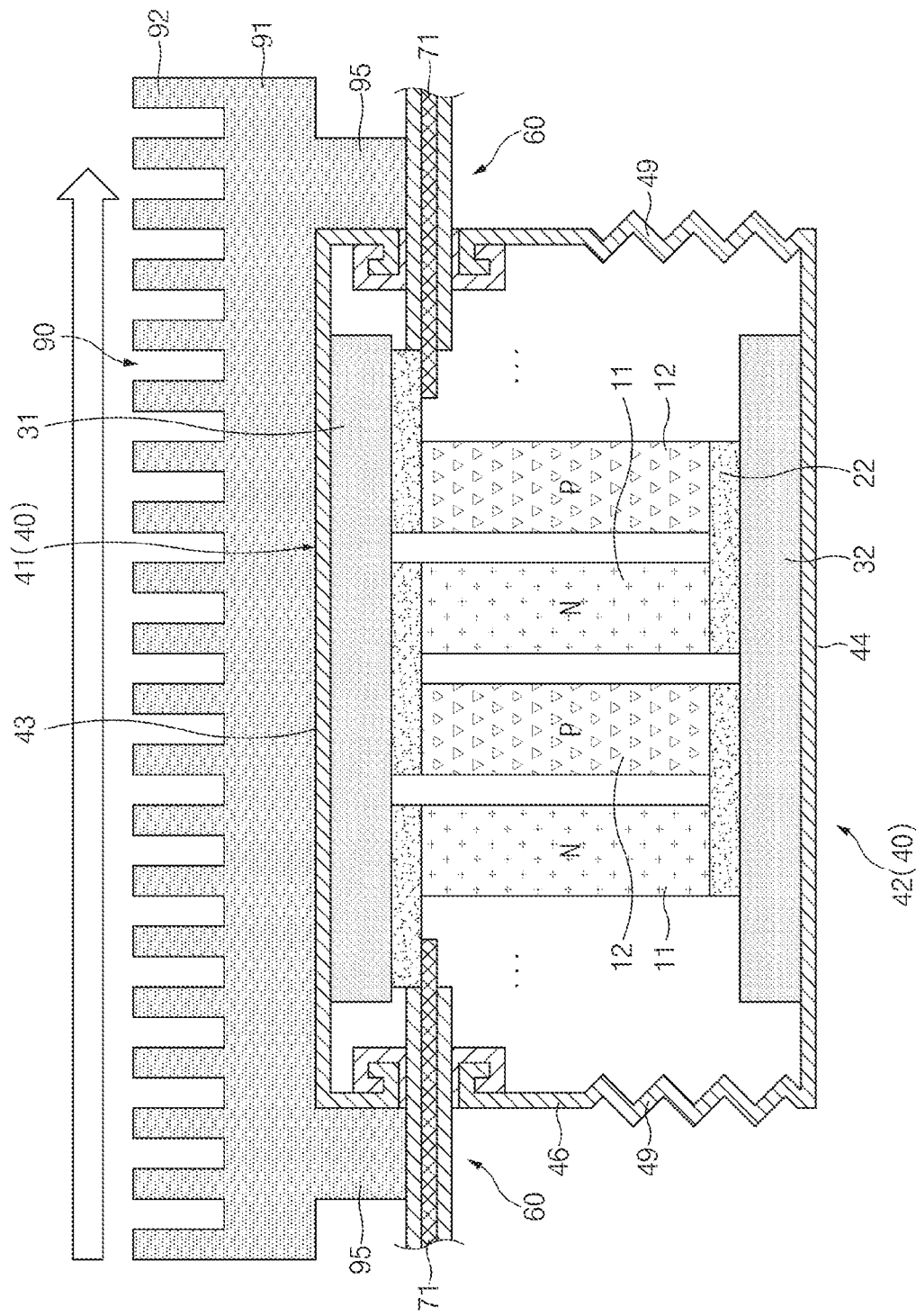
FIG. 8 is a cross-sectional view of a thermoelectric module and a housing for a thermoelectric module, according to another exemplary embodiment of the present disclosure.

Referring to FIGS. 7 and 8, a cooling unit 80 or 90 may be disposed to be adjacent to the low temperature part of the housing, and a portion 85 or 95 of the cooling unit 80 or 90 may be extended to contact or be adjacent to at least a portion of the heat barrier unit 60.

Referring to FIGS. 7 and 8, the cooling unit 80 or 90 may be provided on the first base 43 of the first housing 41, such that the first insulating board 31 and the first base 43 of the first housing 41 adjacent thereto may form the low temperature part.

The cooling unit 80 according to the exemplary embodiment of FIG. 7 includes a cooling body 81 having a channel 82 through which a cooling fluid such as coolant passes, and an extension portion 85 extending from one side of the cooling body 81 toward the heat bather unit 60.

The extension portion 85 may contact or be adjacent to at least a portion of the heat bather unit 60 such that cool air of the cooling body 81 may be transferred to the heat barrier unit 60, thereby preventing heat strain or damage of the heat barrier unit 60 and effectively preventing strain, dielectric breakdown, electrical shorting or the like of the electric wire 71.

The cooling unit 90 according to the exemplary embodiment of FIG. 8 includes a cooling body 91 having cooling fins 92 through which a vapor-phase cooling fluid such as air passes, and an extension portion 95 extending from one side of the cooling body 91 toward the heat barrier unit 60.

The extension portion 95 may contact or be adjacent to at least a portion of the heat bather unit 60, such that cool air of the cooling body 91 may be transferred to the heat barrier unit 60, thereby preventing heat strain or damage of the heat barrier unit 60 and effectively preventing strain, dielectric breakdown, electrical shorting or the like of the electric wire 71.

According to exemplary embodiments, the housing may envelop the external surface of the thermoelectric module, i.e., the external surfaces of the insulating boards and the thermoelectric elements and the electrodes disposed between the insulating boards, thereby effectively preventing an oxidation reaction, chemical changes, and the like that may be caused by external factors, avoid electrical shorting that may be caused by moist, conducting liquid or the like, and protect the individual elements of the thermoelectric module from stress, strain, shear force and the like due to external physical factors.

In particular, heat loss that may occur at the sidewalls of the housings may be minimized, such that the temperature difference between the high temperature part and the low temperature part may be stably secured, which may improve thermoelectric power generation performance.

In addition, thermal stress and thermal shock due to the temperature difference between the high temperature part and the low temperature part may be alleviated, whereby damage to the thermoelectric module may be prevented.

Further, the first and second housings may be firmly assembled by the bonding member, thereby effectively pressurizing the insulating boards, the electrodes, and the thermoelectric elements. Thus, electric resistance and thermal resistance at interfaces of the thermoelectric elements and the electrodes due to temperature changes may be minimized, and thermal resistance at interfaces of the electrodes and the insulating boards may also be minimized.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A housing for a thermoelectric module, the housing comprising:
    a first housing including a first base and a first sidewall disposed on edges of the first base;
    a second housing including a second base and a second sidewall disposed on edges of the second base; and
    a heat barrier unit provided between the first sidewall and the second sidewall, including:
    a bonding member formed of a resin material and configured to seal the first sidewall and the second sidewall;
    a first fitting part provided at a bottom of the first sidewall, the first fitting part including a first horizontal portion extending horizontally from the bottom of the first sidewall, and a first bent portion extending upwardly perpendicular to the first horizontal portion; and
    a second fitting part provided at a top of the second sidewall, the second fitting part including a second horizontal portion extending horizontally from the top of the second sidewall, and a second bent portion extending downwardly perpendicular to the second horizontal portion,
    wherein, the bonding member has a first bonding portion wrapping the first fitting part and a second bonding portion wrapping the second fitting part, and
    wherein the first bonding portion is bonded directly to the first fitting part and the second bonding portion is bonded directly to the second fitting part.

2. The housing according to claim 1, wherein the bonding member is formed of a heat shrinkable film.

3. The housing according to claim 1, wherein the first horizontal portion extends from the first sidewall toward an internal space of the housing, and wherein the second horizontal portion extends from the second sidewall toward the internal space of the housing.

4. The housing according to claim 1, wherein the first horizontal portion extends from the first sidewall toward an exterior space of the first housing, and wherein the second horizontal portion extends from the second sidewall toward an interior space of the second housing.

5. The housing according to claim 1, further comprising a thermal resistance increasing part increasing thermal resistance with respect to a flow of heat transferred through the first and second sidewalls.

6. The housing according to claim 5, wherein the thermal resistance increasing part includes a thin wall portion provided in a portion of at least one of the first and second sidewalls, and the thin wall portion is thinner than the sidewall.

7. The housing according to claim 5, wherein the thermal resistance increasing part includes a non-straight portion provided in a portion of at least one of the first and second sidewalls.

* * * * *